(12) United States Patent
Stephens et al.

(10) Patent No.: US 7,132,327 B2
(45) Date of Patent: Nov. 7, 2006

(54) DECOUPLED COMPLEMENTARY MASK PATTERNING TRANSFER METHOD

(75) Inventors: Tab A. Stephens, Austin, TX (US);
Chong-Cheng Fu, Austin, TX (US);
Charles F. King, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/853,701

(22) Filed: May 25, 2004

(65) Prior Publication Data

US 2005/0277276 A1 Dec. 15, 2005

(51) Int. Cl.
*H01L 21/336* (2006.01)
*H01L 21/3205* (2006.01)
*H01L 21/4763* (2006.01)

(52) U.S. Cl. .................. 438/257; 438/586; 438/585
(58) Field of Classification Search .......... 438/585, 438/586, 257, 256, 301, 593, 621, 700; 430/316; 257/E21.206
See application file for complete search history.

(56) References Cited

U.S. PATENT DOCUMENTS

| | | | | |
|---|---|---|---|---|
| 5,308,741 | A * | 5/1994 | Kemp | 430/312 |
| 5,415,835 | A * | 5/1995 | Brueck et al. | 430/311 |
| 6,042,998 | A * | 3/2000 | Brueck et al. | 430/316 |
| 6,184,151 | B1 * | 2/2001 | Adair et al. | 438/743 |
| 6,233,044 | B1 * | 5/2001 | Brueck et al. | 355/67 |
| 6,764,903 | B1 * | 7/2004 | Chan et al. | 438/586 |
| 6,780,708 | B1 * | 8/2004 | Kinoshita et al. | 438/241 |

FOREIGN PATENT DOCUMENTS

WO    WO 02/25373 A2    3/2002

OTHER PUBLICATIONS

Ebihara, Takeaki et al.; "Beyond $k_1$=0.25 lithography : 70nm L/S patterning using KrF scanners"; Proceedings of SPIE 23$^{rd}$ Annual BACUS Symposium on Photomask Technology; 2003; pp. 985-994; vol. 5256.

Liu, Wei et al; "Generating Sub-30nm Poly-Silicon Gates Using PECVD Amorphous Carbon as Hardmask and Anti-Reflective Coating"; Proceedings of SPIE; 2003; pp. 841-848; vol. 5040; Optical Microlithography XVI.

Tyrell, Brian et al.; "Investigation of the Physical and Practical Limits of Dense-Only Phase Shift Lithography for Circuit Feature Definition"; Proceedings of SPIE; 2002; pp. 503-516; vol. 4692; Design, Process Integration and Characterization for Microelectronics.

Zaidi, Saleem et al: "Nonlinear Processes to Extend Interferometric Lithography"; SPIE Conference on Emerging Lithographic Technologies III; Mar. 1999; pp. 371-378; vol. 3676; SPIE.

\* cited by examiner

*Primary Examiner*—Walter L. Lindsay, Jr.
(74) *Attorney, Agent, or Firm*—Michael J. Balconi-Lamica; David G. Dolezal

(57) ABSTRACT

A patterning method allows for separate transfer of a complementary reticle set. In one embodiment, for example, the method includes etching a phase shift mask (PSM), then etching a cut mask for a cPSM mask. Moreover, a decoupled complementary mask patterning transfer method includes two separate and decoupled mask patterning steps which form combined patterns through the use of partial image transfers into an intermediate hard mask prior to final wafer patterning. The intermediate and final hard mask materials are chosen to prevent image transfer into an underlying substrate or wafer prior to the final etch process.

18 Claims, 8 Drawing Sheets

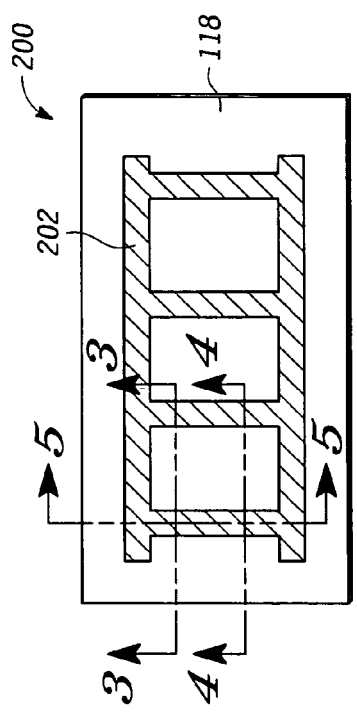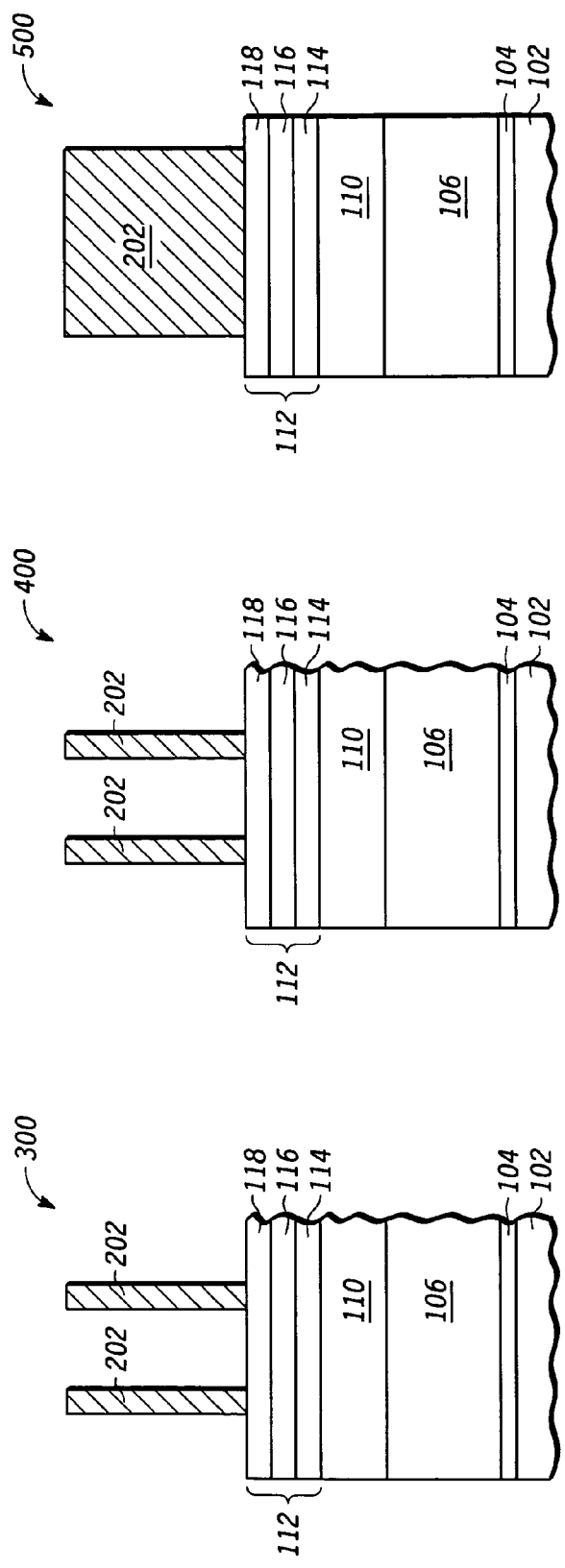

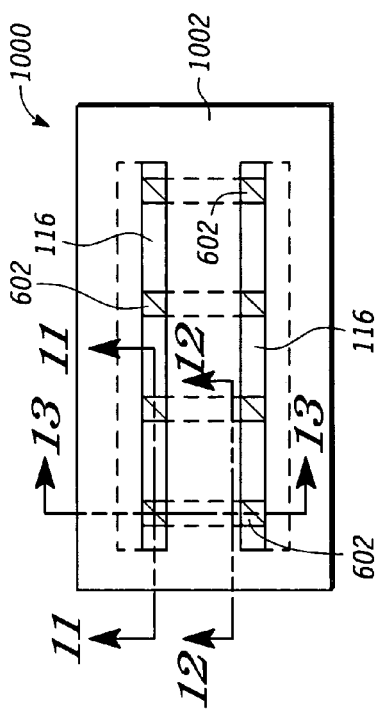
FIG. 10
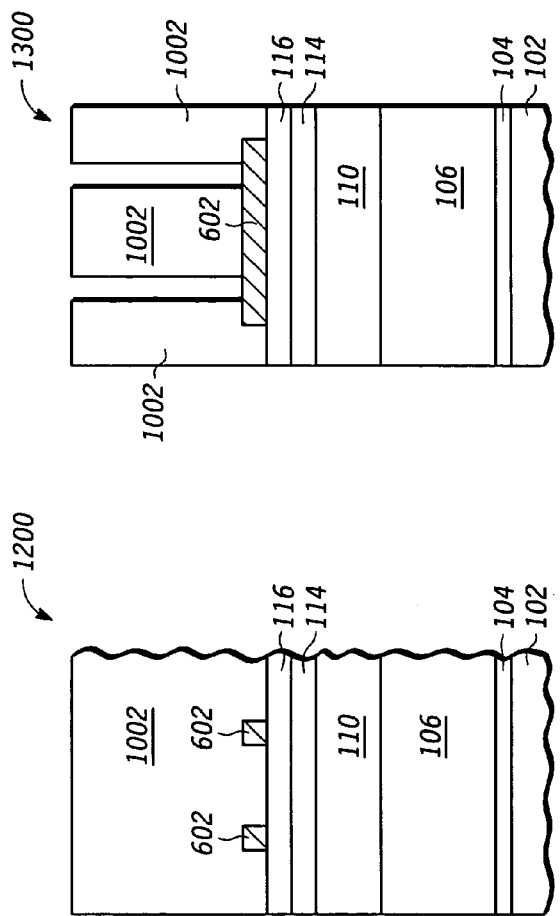
FIG. 13
FIG. 12
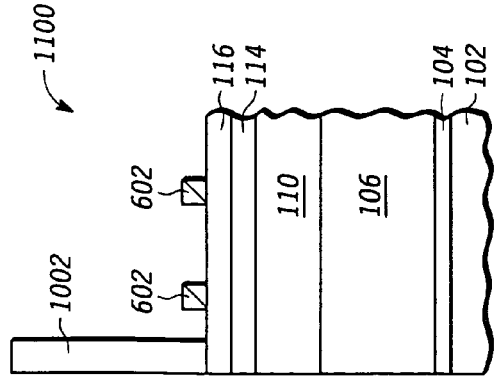
FIG. 11

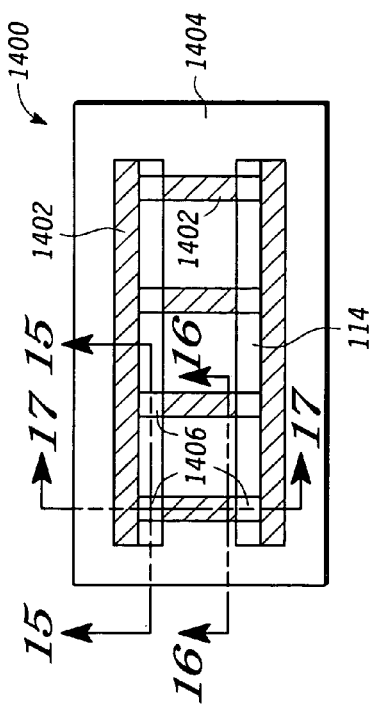
FIG. 14
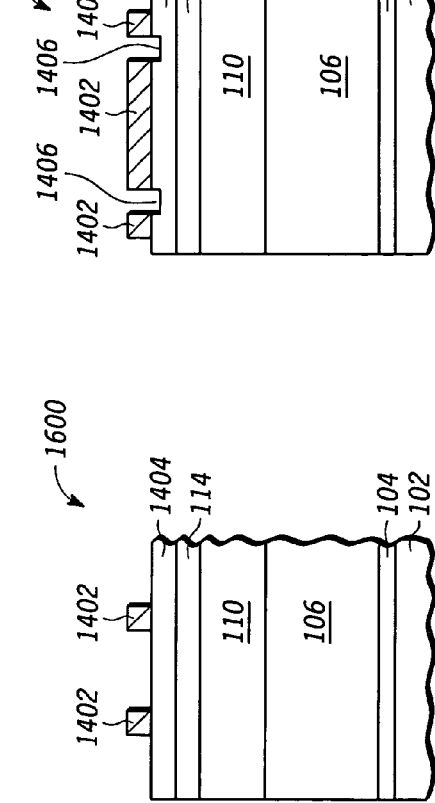
FIG. 17
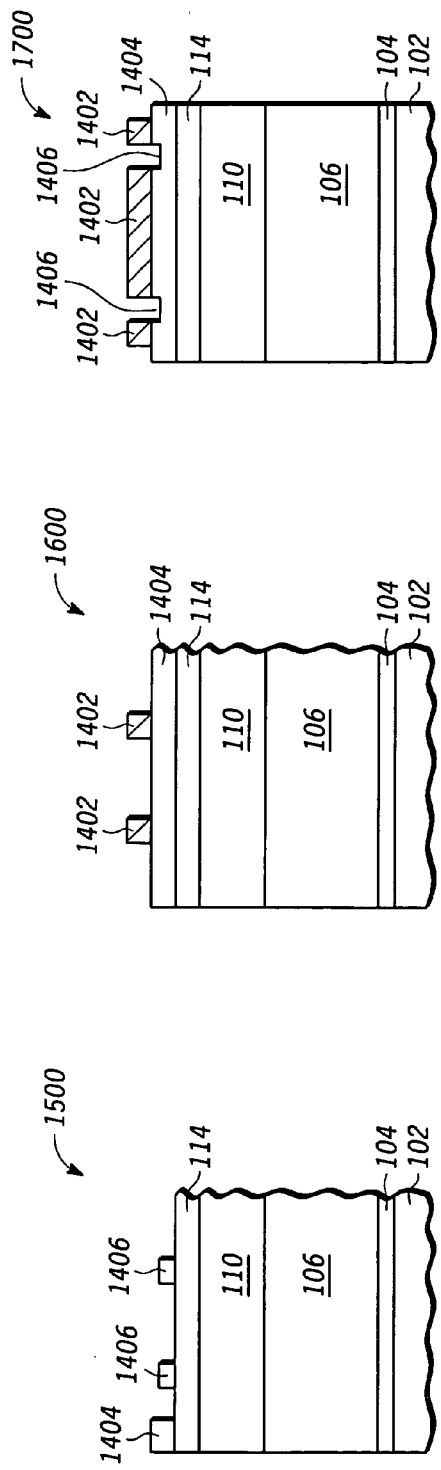
FIG. 16
FIG. 15

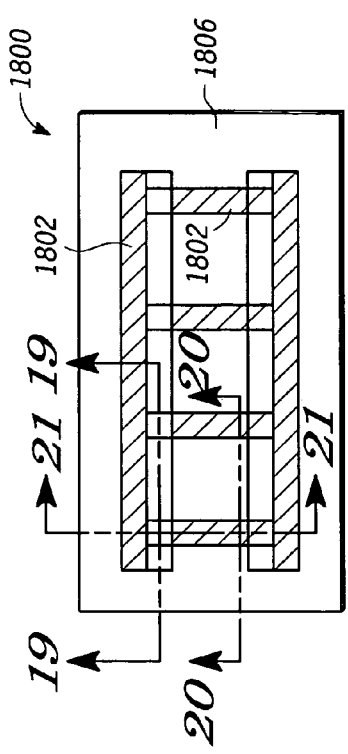
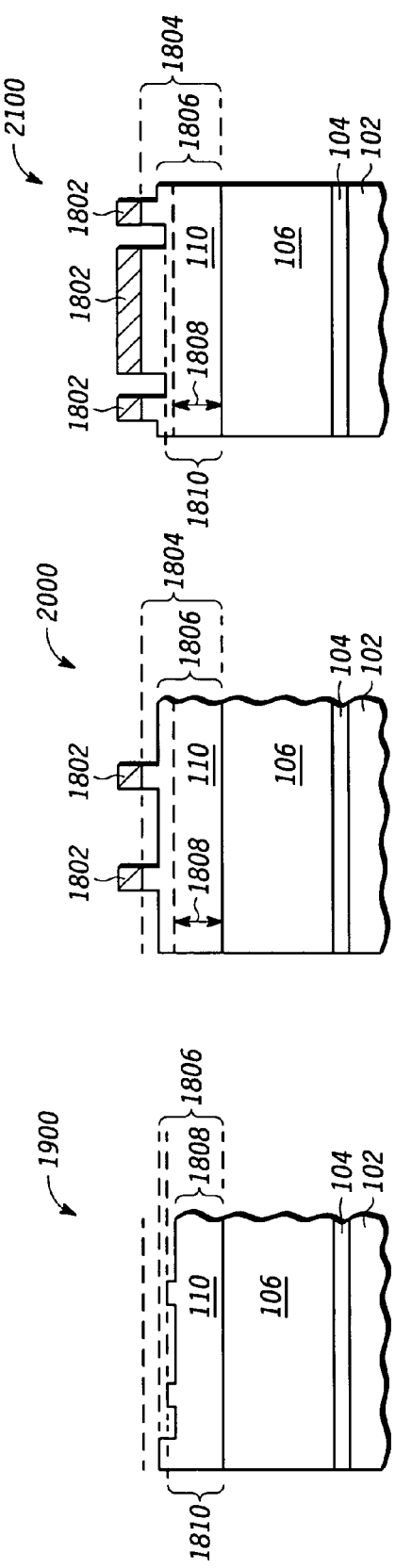

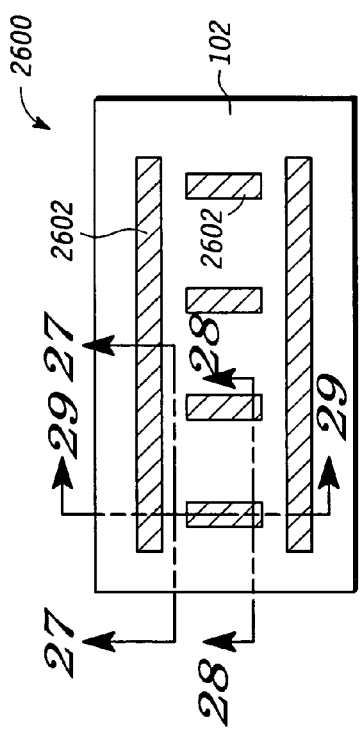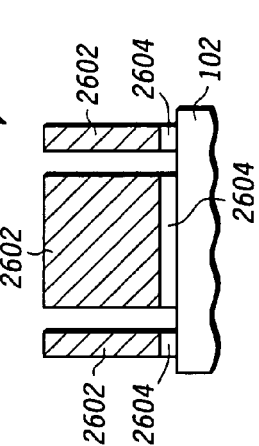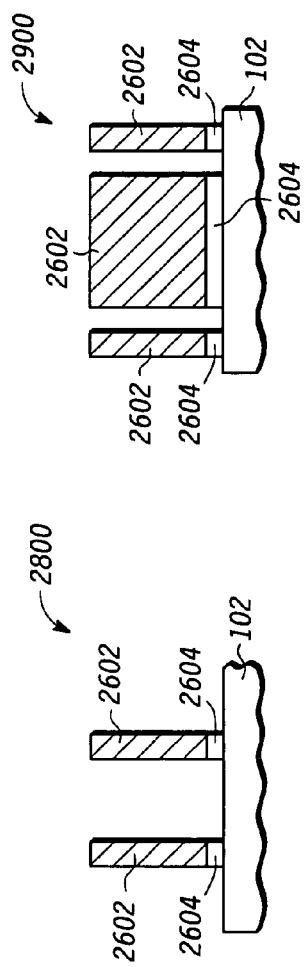

DECOUPLED COMPLEMENTARY MASK PATTERNING TRANSFER METHOD

BACKGROUND

The present disclosures relate to semiconductor device processing, and more particularly, to a decoupled complementary mask patterning transfer method.

Normal two-mask patterning schemes, such as complementary phase shift mask (cPSM), require both phase shift mask and cut mask exposures to occur prior to an etch. However, there are advantages to transferring each of the mask patterns to the substrate separately. These advantages include separate tuning of the exposure conditions for each mask, elimination of flare effects which result in undesirable interactions between exposures, photoresist trimming on anchored features (prior to the cut mask), and inclusion of assist features which might otherwise be impossible due to image coupling effects. Unfortunately, current schemes exacerbate the vertical etch depth differences between the two mask transfers, leading to excessive active pitting at gate, for example.

Accordingly, it would be desirable to provide an improved patterning scheme for overcoming the problems in the art.

SUMMARY

Accordingly to one embodiment of the present disclosure, a decoupled complementary mask patterning transfer method includes two separate and decoupled mask patterning steps which form combined patterns through the use of partial image transfers into an intermediate hard mask prior to final wafer patterning. The intermediate and final hard mask materials are chosen to prevent image transfer into an underlying substrate or wafer prior to the final etch process.

One embodiment of the present disclosure addresses the issues discussed above by implementing a series of hard masks with different etch resistances. In the case of the cPSM, the PSM image is transferred to a top hard mask, followed by the transfer of a cut mask image. The etch resistance difference between the hard masks is then used to transfer the combined image to a target stack without incurring the issues observed in the prior art. More generally, this disclosure explains a method for adding and subtracting patterns into an intermediate hard mask prior to final transfer to the target stack.

BRIEF DESCRIPTION OF THE DRAWINGS

The embodiments of the present disclosure are illustrated by way of example and not limited by the accompanying figures, in which like references indicate similar elements, and in which:

FIG. 2 is a top down diagram view of the stack of FIG. 1 after patterning of the photoresist using a first mask and prior to a first etch according to one embodiment of the present disclosure;

FIGS. 3–5 are cross-sectional views taken along lines 3—3, 4—4 and 5—5, respectively, of the structure of FIG. 2;

FIG. 10 is a top down diagram view of the stack of FIG. 6 after patterning of a second photoresist using a second mask according to one embodiment of the present disclosure;

FIGS. 11–13 are cross-sectional views taken along lines 11—11, 12—12 and 13—13, respectively, of the structure of FIG. 10;

FIG. 14 is a top down diagram view of the stack of FIG. 10 after a cut mask trim, etch and clean according to one embodiment of the present disclosure;

FIGS. 15–17 are cross-sectional views taken along lines 15—15, 16—16 and 17—17, respectively, of the structure of FIG. 14;

FIG. 18 is a top down diagram view of the stack of FIG. 14 after a second hard mask etch (corresponding to a first part of a "gate" etch) according to one embodiment of the present disclosure;

FIGS. 19–21 are cross-sectional views taken along lines 19—19, 20—20 and 21—21, respectively, of the structure of FIG. 18;

FIG. 26 is a top down diagram view of the stack of FIG. 22 after a target layer etch (corresponding to a remainder part of a "gate" etch) according to one embodiment of the present disclosure; and FIGS. 27–29 are cross-sectional views taken along lines 27—27, 28—28 and 29—29, respectively, of the structure of FIG. 26.

Skilled artisans appreciate that elements in the figures are illustrated for simplicity and clarity and have not necessarily been drawn to scale. For example, the dimensions of some of the elements in the figures may be exaggerated relative to other elements to help improve an understanding of the embodiments of the present disclosure.

DETAILED DESCRIPTION

Figure 1:
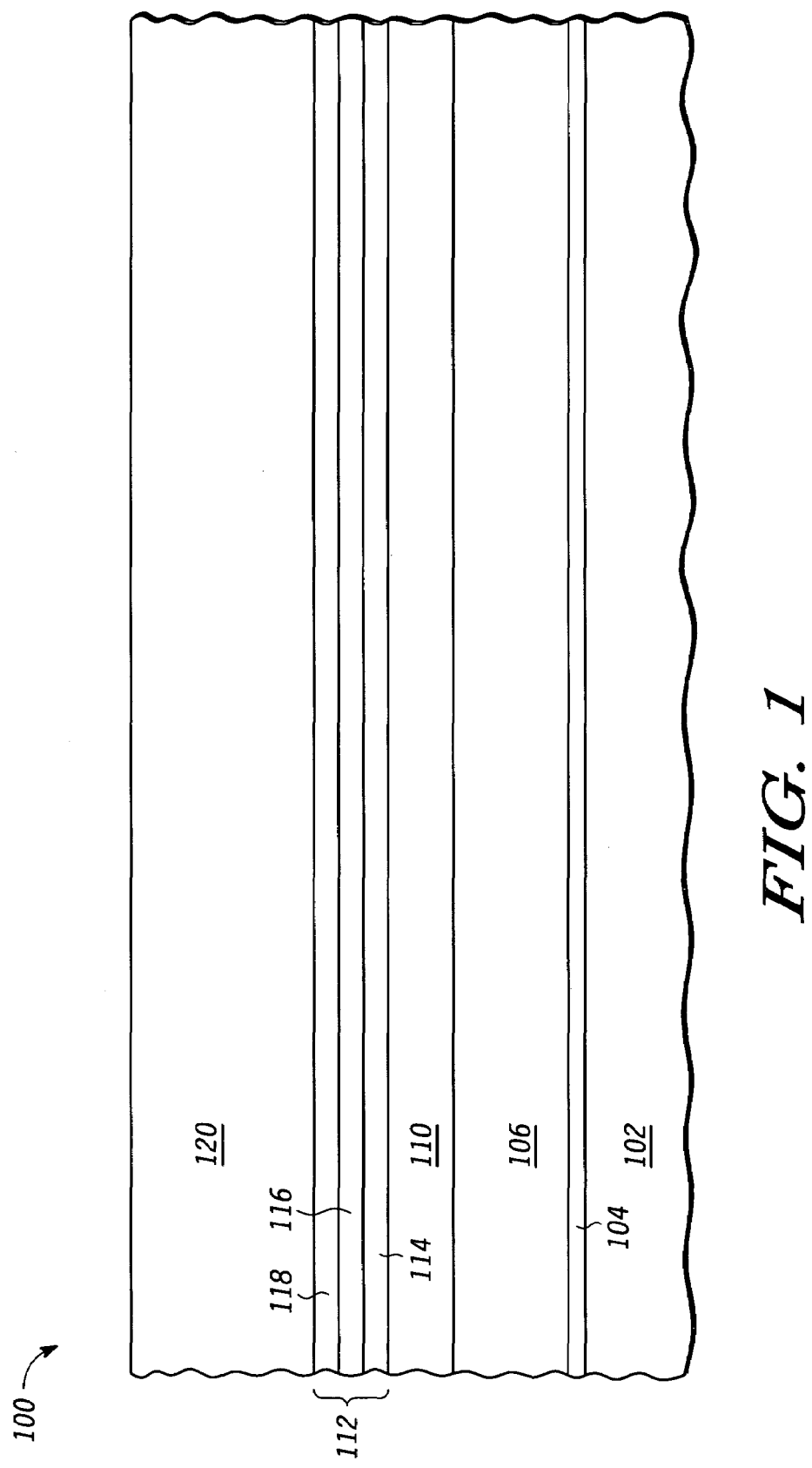
FIG. 1 is a cross-sectional view of a stack used in a decoupled complementary mask patterning method according to one embodiment of the present disclosure.

FIG. 1 is a cross-sectional view of a stack 100 used in a decoupled complementary mask patterning method, for example in a gate patterning process flow, according to one embodiment of the present disclosure. Stack 100 includes a substrate 102, a gate dielectric 104 overlying substrate 102, a target layer 106 overlying gate dielectric 104, and a first hard mask 110 overlying target layer 106. Substrate 102 can include, for example, a bulk substrate, a bonded wafer substrate (e.g., a semiconductor on insulator, silicon on insulator, germanium on insulator, or similar substrate), or other suitable substrate for a particular semiconductor device fabrication. Gate dielectric 104 can include, for example, a gate oxide, a SiON, metal oxide, or other suitable dielectric for a particular semiconductor device fabrication. Target layer 106 can include, for example, a polysilicon layer, a metal layer, a metal oxide layer, a dielectric layer, or other suitable layer or layers for a particular semiconductor device fabrication. Furthermore, first hard mask 110 can include, for example, one or more of an amorphous carbon organic antireflective coating (ARC) (i.e., an organic antireflective coating (OARC)), a spin on bottom ARC, a low K dielectric, or other suitable hard mask for a particular semiconductor device fabrication. In another embodiment, a second dielectric layer (not shown) can be provided in between hard mask 110 and the underlying target layer 106.

With reference still to FIG. 1, a second hard mask stack 112 overlies first hard mask 110. In one embodiment, second hard mask stack 112 includes one or more layers, for example, 114, 116 and 118. Furthermore, a photoresist layer 120 overlies second hard mask stack 112. The one or more layers of the second hard mask 112 can include, for example, first, second, and third dielectric cap layers indicated by reference numerals 114, 116, and 118, respectively. A dielectric cap layer can include, for example, an oxide or nitride. In one embodiment, first, second, and third dielectric cap layers 114, 116, and 118 include an oxide, a nitride overlying the oxide, and an oxide overlying the nitride, respectively. This arrangement allows for etch selectivity among the cap layers, in addition to allow endpoint signals, for improved etch control of the first and second pattern transfer etches. In addition, in one embodiment, the first hard mask 110 includes a first material and the second hard mask stack 112 includes a second material, wherein the first material and the second material are selectively etchable with respect to each other. Still further, in another embodiment, layer 112 can include a single layer of hard mask material that can be manipulated in a similar manner as a stack of layers, further to be discussed below.

FIG. 2 is a top down diagram view 200 of the stack 100 of FIG. 1 after primary patterning of the photoresist layer 120 using a first mask (not shown) and prior to a first etch, according to one embodiment of the present disclosure. View 200 illustrates a patterned photoresist layer, generally indicated by reference numeral 202. The patterned photoresist 202 includes regions corresponding to (i) critical portions and (ii) undesirable portions, as will be better understood herein below from the subsequent figures and related descriptions. The patterning of the photoresist layer 120 also exposes portions of the second hard mask stack 112. In particular, the exposed portions of the second hard mask stack 112 correspond to exposed portions of the third dielectric cap layer 118, as shown in the top down diagram view 200.

FIGS. 3–5 are cross-sectional views taken along lines 3—3, 4—4 and 5—5, respectively, of the structure of FIG. 2. In particular, view 300 illustrates a cross-sectional view of the structure of FIG. 2, taken along lines 3—3. View 400 illustrates a cross-sectional view of the structure of FIG. 2, taken along lines 4—4. View 500 illustrates a cross-sectional view of the structure of FIG. 2, taken along lines 5—5, which is perpendicular to the views of FIGS. 3 and 4. In one embodiment, view 300 shows part of the undesirable portions of patterned photoresist 202, whose pattern transfer into second hard mask stack 112, and layer 118 in particular, will be addressed in the subsequent figures. View 400 shows part of the critical portions of patterned photoresist 202, whose pattern transfer into second hard mask stack 112, and layer 118 in particular, will be preserved in the subsequent figures. View 500 shows both critical portions and undesirable portions of patterned photoresist 202. The subsequent figures will show how the pattern transfer into second hard mask stack 112 is affected by the addition of the second mask. In one embodiment, where the first hard mask 110 is comprised of an ash and/or wetclean-sensitive material, the remaining portions of second hard mask stack 112 will protect first hard mask stack 110 from undesired damage and/or removal.

Figure 6:
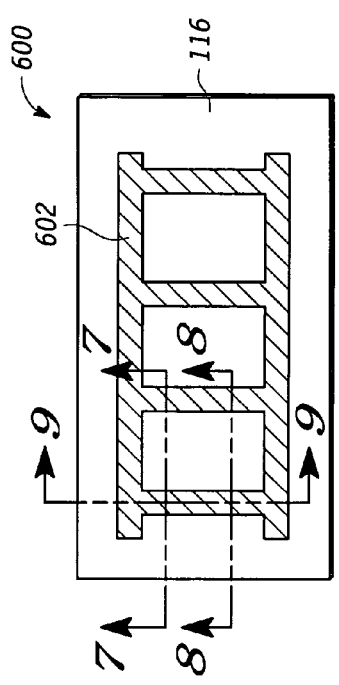
FIG. 6 is a top down diagram view of the stack of FIG. 2 after a first trim, etch, and clean according to one embodiment of the present disclosure.

FIG. 6 is a top down diagram view 600 of the stack of FIG. 2 after a first trim, etch, and clean according to one embodiment of the present disclosure. To increase figure legibility, the effects of a photoresist and/or hard mask trim are not shown. In particular, view 600 illustrates a remaining portion 602 of the third dielectric cap layer 118, having been patterned according to the etch of the pattern of photoresist 202 of FIG. 2 and the subsequent photoresist removal to accomplish a first pattern transfer. In one embodiment, the first pattern transfer includes a first trim, etch, and clean. In one embodiment, the trim includes a photoresist trim. The etch includes a partial hard mask etch of stack 112. In addition, the clean includes an ash and/or wet clean process to remove any remaining resist 202. It is to be noted that the remaining portion 602 of dielectric cap layer 118 occurs in regions corresponding to (i) critical portions and (ii) undesirable portions, as will also be better understood herein below from the subsequent figures and related descriptions. The first trim, etch, and clean also expose additional portions of the second hard mask stack 112. In particular, the additional exposed portions of the second hard mask stack 112 correspond to exposed portions of the second dielectric cap layer 116, as shown in the top down diagram view 600. In one embodiment, the exposed portion of layer 116 represents the etch depth of the first pattern transfer. In another embodiment, the exposed portion of layer 116 represents the exposing of a second portion of the second dielectric cap layer which allows the endpoint control of the first pattern transfer etch process. A third embodiment combines the previous two embodiments.

Figure 9:
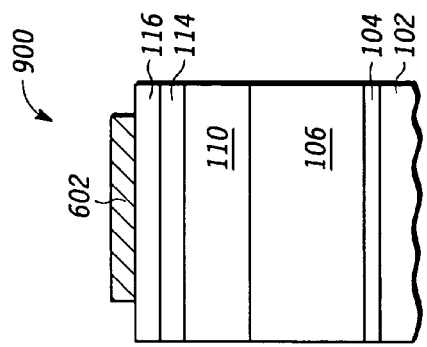
FIGS. 7–9 are cross-sectional views taken along lines 7—7, 8—8 and 9—9, respectively, of the structure of FIG. 6.
Figure 8:
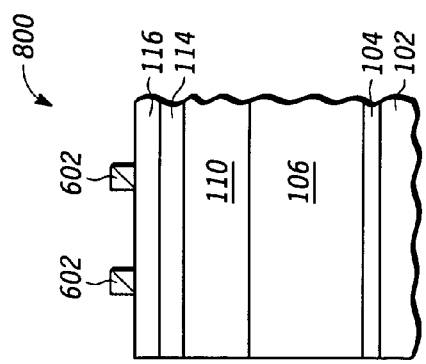
Figure 7:
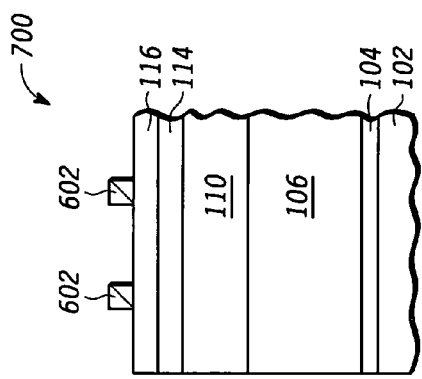

FIGS. 7–9 are cross-sectional views taken along lines 7—7, 8—8 and 9—9, respectively, of the structure of FIG. 6. In particular, view 700 illustrates a cross-sectional view of the structure of FIG. 6, taken along lines 7—7. View 800 illustrates a cross-sectional view of the structure of FIG. 6, taken along lines 8—8. View 900 illustrates a cross-sectional view of the structure of FIG. 6, taken along lines 9—9, which is perpendicular to the views of FIGS. 7 and 8. In one embodiment, view 700 shows part of the undesirable portions of remaining portion 602 of the third dielectric cap layer 118. View 800 shows part of the critical portions of the remaining portion 602 of the third dielectric cap layer 118. View 900 shows both critical portions and undesirable portions of the remaining portion 602 of the third dielectric cap layer 118.

FIG. 10 is a top down diagram view 1000 of the stack of FIG. 6 after patterning of a second photoresist using a cut mask according to one embodiment of the present disclosure. In particular, a second photoresist is applied to the stack of FIG. 6 and patterned using a cut mask. View 1000 illustrates a remaining portion 1002 of the second photoresist after being patterned using the cut mask. In addition, view 1000 illustrates exposed portions of the second hard mask stack 112, that is, corresponding to exposed remaining portions 602 of third dielectric cap layer 118 and exposed portions of second dielectric cap layer 116. In addition, unexposed portions of 602 that are covered over by the second photoresist 1002 are illustrated in FIG. 10 with the use of phantom (i.e., dashed) lines. Furthermore, the exposed remaining portions 602 of third dielectric cap layer 118 occur in regions corresponding to the undesirable portions to be subsequently removed; whereas, the unexposed remaining portions 602 correspond to features of critical portions to be subsequently transferred into an underlying layer, such as target layer 106.

In addition, the exposed portions of second dielectric cap layer 116 which are not covered by the exposed remaining portions 602 of third dielectric cap layer 118 or the second photoresist 1002 represents the portion of the wafer that is not covered by photoresist in either the first or second mask pattern. In one embodiment, these doubly-exposed portions of layer 116 represent the portion of the wafer that will experience the leading edge of the etch front during the remaining gate etch steps, and they are the wafer portions most likely to have problems (i.e., too much overetch and/or insufficient selectivity during gate etch leading to active silicon recess or pitting, for example.) The etch selectivity difference between the first hard mask 110 and the second hard mask stack 112 underneath first hard mask 110 is used to diminish or eliminate these problems, and thus being distinguished over the prior art.

FIGS. 11–13 are cross-sectional views taken along lines 11—11, 12—12 and 13—13, respectively, of the structure of FIG. 10. In particular, view 1100 illustrates a cross-sectional view of the structure of FIG. 10, taken along lines 11—11. The exposed remaining portions 602 of layer 118 as shown in FIG. 11 occur in an area or region of the structure 1100 that corresponds to undesirable portions of the structure to be subsequently removed. The second photoresist 1002 in FIG. 11 will prevent a portion of the second pattern transfer into the remaining second hard mask stack 112, causing another undesirable portion of the structure. However, because this portion was exposed during the first pattern transfer, this undesirable portion will be removed prior to the final etch process, as will be discussed further herein. View 1200 illustrates a cross-sectional view of the structure of FIG. 10, taken along lines 12—12. The remaining portions 602 of layer 118 as shown in FIG. 12 are covered by the second photoresist 1002 and occur in an area or region of the structure 1200 that corresponds to desirable portions of the structure. The desirable portions of the structure correspond to features to be subsequently transferred into the underlying target layer 106. View 1300 illustrates a cross-sectional view of the structure of FIG. 10, taken along lines 13—13, which is perpendicular to the views of FIGS. 11 and 12. In view 1300, the portions of remaining portions 602 of layer 118 that are covered by second photoresist 1002 represent the critical portions of the structure, while the portions of remaining portions 602 of layer 118 not covered by second photoresist 1002 and the portions of layer 116 not covered by portions 602 represent the undesirable portions of the structure.

FIG. 14 is a top down diagram view 1400 of the stack of FIG. 10 after a cut mask trim, etch and clean according to one embodiment of the present disclosure. In particular, view 1400 illustrates a remaining portion 1402 of a remaining portion 602 of the third dielectric cap layer 118, the third dielectric cap layer 118 having been patterned after the cut mask trim, etch, and clean according to the pattern of photoresist 1002 of FIG. 10. In one embodiment, the cut mask trim includes a photoresist trim. The etch includes a second partial hard mask etch. In addition, the clean includes an ash and/or wet clean process to remove any remaining resist 1002. In one embodiment, where the first hard mask 110 is comprised of an ash and/or wet clean-sensitive material, the remaining portions of second hard mask stack 112 will protect first hard mask stack 110 from undesired damage and/or removal.

It is to be noted that the remaining portions 1402 occur in regions corresponding to critical portions of the second patterning mask and were protected from the second etch by the second patterning mask. In addition, all undesirable portions have been removed at this point in the decoupled complementary mask patterning method according to one embodiment of the present disclosure. In one embodiment, the undesirable portions of second hard mask 112 have less thickness for pattern transfer than the critical portions of the structure. Thus, an etch process can be used to remove the undesirable portions of the second hard mask while retaining the critical portions. View 1400 also illustrates a remaining portion 1404 of the second dielectric cap layer 116, having been patterned after the second mask trim, etch, and clean according to the pattern of photoresist 1002 of FIG. 10. View 1400 also shows remaining portion 1406 of the second dielectric cap layer 116, having been transferred from portions 602 into layer 116 by the second transfer etch.

Furthermore, remaining portion 1404 includes (i) regions outside of the critical portions of the first patterning mask and (ii) regions within the undesirable portions of the first patterning mask. The cut mask trim, etch, and clean also expose additional portions of the second hard mask stack 112. In particular, the additional exposed portions of the second hard mask stack 112 correspond to exposed portions of the first dielectric cap layer 114. In one embodiment, the exposed portion of layer 114 represents the etch depth of the first and second pattern transfers. In another embodiment, the exposed portion of layer 114 represents the exposing of a first portion of the second dielectric cap layer which allows the endpoint control of the second pattern transfer etch process. A third embodiment combines the previous two embodiments.

FIGS. 15–17 are cross-sectional views taken along lines 15—15, 16—16 and 17—17, respectively, of the structure of FIG. 14. In particular, view 1500 illustrates a cross-sectional view of the structure of FIG. 14, taken along lines 15—15. View 1600 illustrates a cross-sectional view of the structure of FIG. 14, taken along lines 16—16. View 1700 illustrates a cross-sectional view of the structure of FIG. 14, taken along lines 17—17, which is perpendicular to the views of FIGS. 15 and 16. Up to this point in the process, the first hard mask 110 remains protected by the overlying second hard mask stack 112, the second hard mask stack 112 having been patterned with a desired pattern. After the first and second pattern transfers, the etch depths in FIGS. 14–17 from the first and second pattern transfers can be separated into 4 distinct categories—(1) portions 1402, which have been covered by both first and second patterning steps and represent the critical portions of the pattern, (2) the exposed portions of 1404 which were exposed during the first patterning step but covered in the second patterning step, (3) the portions 1406 which were covered during the first patterning step but exposed during the second patterning step, and (4) the exposed portions of layer 114 which were exposed during both first and second patterning steps. In the figures, the portions 1406 are shown as having less remaining thickness of second hard mask stack 112 than the portions 1404. The relative remaining thicknesses of these portions depend on the etch depths achieved by the first and second hard mask etches and the relative etch resistances of the individual layers 114, 116, and 118 of second hard mask stack 112. Thus, the figures represent one example of the combined image transfers.

In one embodiment, the first hard mask 110 comprises an organic anti-reflective coating (OARC), for example, an amorphous carbon film, such as, APF™, available from Applied Materials. If a photoresist were to contact the OARC directly, then undesirable poisoning of the photoresist would occur. Furthermore, exposing the OARC to an ash and/or wet clean process damages the OARC. Accordingly, the embodiments of the present disclosure advantageously keep the OARC layer protected until a desired oxide pattern is in desired regions corresponding to desired patterned features, while not in other areas corresponding to undesired regions. Such desired patterned feature can include, for example, gate electrodes, and interconnect features of semiconductor devices.

FIG. 18 is a top down diagram view 1800 of the stack of FIG. 14 after a non-patterned (i.e., no photoresist) etch of the remaining second hard mask (corresponding to a first part of a "gate" etch) in the form of a blanket dielectric etch according to one embodiment of the present disclosure. In particular, view 1800 illustrates a remaining portion 1802 of the first dielectric cap layer 114, having been patterned after the blanket dielectric etch according to a pattern of portions 1402, as shown in FIGS. 14–17. The remaining portion 1802 includes regions corresponding to critical portions of the first patterning mask alone. View 1800 also illustrates a remaining portion of the first hard mask 110, having different thicknesses represented by reference numerals 1804, 1806, 1808, and 1810 and having been patterned after the blanket dielectric etch according to a pattern of portions 1402, 1404, and 1406, as shown in FIGS. 14–17. The remaining portions 1804 include an original thickness of the first hard mask 110, patterned according to portion 1402. The remaining portions 1806 include a first reduced thickness of the first hard mask 110, patterned according to the pattern of 1404. The remaining portion 1808 includes a second reduced thickness of the first hard mask 110, patterned according to regions outside of portions 1402, 1404, and 1406. The remaining portions 1810 include a first reduced thickness of the first hard mask 110, patterned according to the pattern of 1406.

FIGS. 19–21 are cross-sectional views taken along lines 19—19, 20—20 and 21—21, respectively, of the structure of FIG. 18. In particular, view 1900 illustrates a cross-sectional view of the structure of FIG. 18, taken along lines 19—19. View 2000 illustrates a cross-sectional view of the structure of FIG. 18, taken along lines 20—20. View 2100 illustrates a cross-sectional view of the structure of FIG. 18, taken along lines 21—21, which is perpendicular to the views of FIGS. 19 and 20. The four remaining thicknesses of the first hard mask 110 are clearly displayed in these cross-sectional views. In one embodiment, remaining portion 1808 of first hard mask 110 represents the thinnest portion of 110 and the leading etch front by virtue of not being protected in either the first or second pattern transfer etches. Portion 1808 is sufficiently thick to prevent the blanket dielectric etch from reaching and etching the underlying target layer 106. In another embodiment, the first hard mask 110 possesses greater etch resistance to the blanket dielectric etch than does the portions of second hard mask stack 112. This allows the etch depth differences induced among the four combinations of etch patterning/exposing to be reduced in the first hard mask 110.

Figure 22:
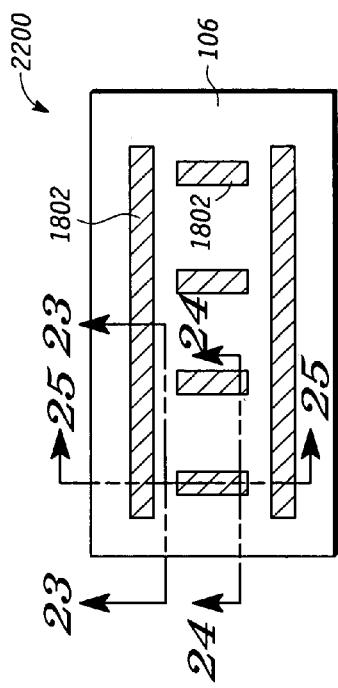
FIG. 22 is a top down diagram view of the stack of FIG. 18 after a first hard mask etch (corresponding to a second part of a "gate" etch) according to one embodiment of the present disclosure.

FIG. 22 is a top down diagram view of the stack of FIG. 18 after etching the first hard mask (corresponding to a second part of a "gate" etch) according to one embodiment of the present disclosure. In one embodiment, the remaining portions 1802 and the target layer 106 have much greater etch resistance than the exposed portions of the first hard mask 110. This allows the portion 1802, which includes only the critical portions of the structure, to transfer its pattern into the first hard mask 110 without substantially etching the target layer 106. While the illustrations indicate a purely anisotropic first hard mask etch, another embodiment allows for an isotropic component of the etch to trim the portions of the first hard mask 110 under portions 1802 of the second hard mask. Another embodiment removes all portions of first hard mask 110, not including first hard mask portions 1804, to expose portions of the target stack 106. In particular, view 2200 illustrates the remaining portions 1802 of the first dielectric cap layer 114 (and underlying remaining portions 1804 of the first hard mask 110). As indicated above, the remaining portions 1802 of the first dielectric cap layer 114 and the underlying remaining portions 1804 of the first hard mask 110 includes regions corresponding to critical portions of the first patterning mask alone. View 2200 also illustrates exposed portions of the target layer 106 not covered by the remaining portions 1802 and 1804. In one embodiment, the target layer 106 comprises an organic ARC.

Figure 25:
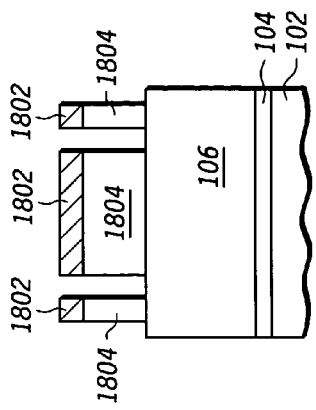
FIGS. 23–25 are cross-sectional views taken along lines 23—23, 24—24 and 25—25, respectively, of the structure of FIG. 22.
Figure 24:
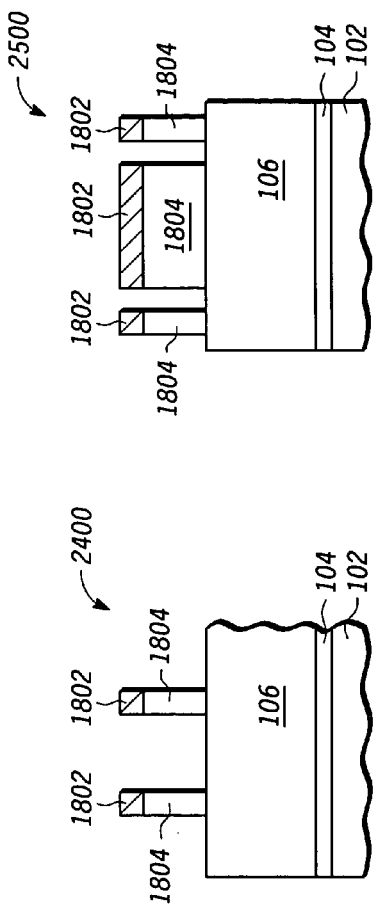
Figure 23:
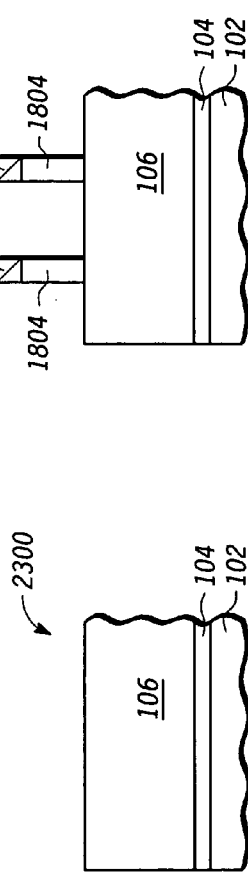

FIGS. 23–25 are cross-sectional views taken along lines 23—23, 24—24 and 25—25, respectively, of the structure of FIG. 22. In particular, view 2300 illustrates a cross-sectional view of the structure of FIG. 22, taken along lines 23—23. View 2400 illustrates a cross-sectional view of the structure of FIG. 22, taken along lines 24—24. View 2500 illustrates a cross-sectional view of the structure of FIG. 22, taken along lines 25—25, which is perpendicular to the views of FIGS. 23 and 24.

FIG. 26 is a top down diagram view of the stack of FIG. 22 after a target layer etch (corresponding to a remainder part of a "gate" etch) and subsequent cleans to remove the remaining portions of second hard mask 1802 and first hard mask 1804 according to one embodiment of the present disclosure. In particular, view 2600 illustrates the remaining portions 2602 of the target layer 106 and underlying remaining portions 2604 of the gate dielectric layer 104. The remaining portions 2602 of the target layer 106 occur in the regions corresponding to the critical portions of the first patterning mask. View 2600 also illustrates exposed portions of the substrate 102 not covered by the remaining portions 2602 (and underlying remaining portions 2604). As a result of the method according to the embodiments of the present disclosure, the exposed portions of the substrate 102 are kept substantially unharmed and intact during the etching processes.

FIGS. 27–29 are cross-sectional views taken along lines 27—27, 28—28 and 29—29, respectively, of the structure of FIG. 26. In particular, view 2700 illustrates a cross-sectional view of the structure of FIG. 26, taken along lines 27—27. View 2800 illustrates a cross-sectional view of the structure of FIG. 26, taken along lines 28—28. View 2900 illustrates a cross-sectional view of the structure of FIG. 26, taken along lines 29—29, which is perpendicular to the views of FIGS. 27 and 28. In particular, views 2800 and 2900 illustrate remaining portions 2602 of the target layer 106 and remaining portions 2604 of the gate dielectric layer 104. The remaining portions 2602 and 2604 are in the regions corresponding to critical portions of the first patterning mask.

Accordingly, the embodiments of the present disclosure allow for two separate and decoupled mask exposures through the use of partial image transfers into an intermediate hard mask (described herein as a second hard mask) prior to final wafer patterning with a final hard mask (described herein as a first hard mask). The intermediate and final hard mask materials are chosen to prevent image transfer into the underlying wafer or substrate prior to the final etch process.

Furthermore, the present embodiments use a combination of dielectric capping materials to accept intermediate image transfers from each of the photolithographic masks. The combined intermediate images are then transferred to an organic antireflective coating (OARC) which additionally functions as the patterning hard mask for an underlying gate stack. While the embodiments presented herein focus on a gate electrode stack, the same can also apply to other modular stacks and other combinations of hard masks.

Furthermore, the embodiments of the present disclosure allow for two masks to be used in a cPSM scheme (i.e., the PSM mask and cut mask) and to have separately tuned exposure conditions without influencing each other (flare effects, etc). In addition, the embodiments allow for photoresist mask (PR) trim on "anchored" features (prior to cut mask), preventing pattern collapse of small features, such as gate electrode features. The embodiments also reduce transistor pullback between active and field regions. Still further, the embodiments allow for inclusion of assist features (scattering bars, for example) in each of the complementary masks which otherwise might not be feasible due to coupling of the images.

Other embodiments of the of the present disclosure include, but are not limited to, (1) the extension of the technique to more than two masks, (2) the separation of exposure for different types of features (a complementary set of an isolated feature mask and a dense feature mask or a complementary set of a horizontal feature mask and a vertical feature mask, for example), (3) extension to other mask layers, such as contact, via, and tight pitch metal, and (4) allowing subnominal pitch lines by using two complementary mask at gate or other layers.

In the foregoing specification, the disclosure has been described with reference to various embodiments. However, one of ordinary skill in the art appreciates that various modifications and changes can be made without departing from the scope of the present embodiments as set forth in the claims below. For example, the embodiments of the present disclosure can be applied to benefit current and future generation microprocessors and/or advanced memory devices. In addition, the embodiments of the present disclosure can be used to push feature dimensions beyond single mask capabilities. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements by may include other elements not expressly listed or inherent to such process, method, article, or apparatus.

What is claimed is:

1. A method of making a semiconductor device, the method comprising:
providing a wafer with a first layer,
forming a non-patterned first hard mask over the first layer;
forming a second hard mask stack over the non-patterned first hard mask;
patterning the second hard mask stack according to a first pattern, wherein the patterning includes a first partial etching of the second hard mask stack to a first thickness;
patterning for a second time, the second hard mask stack according to a second pattern, wherein the patterning for a second time includes a second partial etching of the second hard mask stack to a second thickness;
blanket etching the second hard mask stack to form a first plurality of pattern structures of the second hard mask stack after the patterning for a second time, wherein the blanket etch also partially etches into portions of the first hard mask exposed by the blanket etch;
etching the first hard mask with the first plurality of pattern structures to form a second plurality of pattern structures of the first hard mask, without substantially etching portions of the first layer exposed by the etching of the first hard mask; and
etching the first layer with the second plurality of pattern structures to form a third plurality of pattern structures of the first layer, wherein portions of the wafer exposed by the etching of the first layer are kept substantially unharmed during the etching of the first layer,
wherein the first hard mask includes a first material, the second hard mask stack includes a second material, and the first material is selectively etchable from the second material and the second material is selectively etchable from the first material, and
wherein the first material is selectively etchable from the material of the first layer, allowing reduction of etch depth differences in the second plurality of pattern structures of the first hard mask prior to forming a third plurality of pattern structures in the first layer.

2. The method of claim 1 wherein the first layer includes at least one of the group of silicon, a metal, a metal oxide, and a dielectric.

3. The method of claim 1 wherein the third plurality of pattern structures includes a gate structure for a transistor.

4. The method of claim 1 wherein the first hard mask includes at least one of the group of an amorphous carbon organic antireflective coating (OARC), a spin on bottom ARC, and a low K dielectric.

5. The method of claim 1 wherein the etching the first layer with the second plurality of pattern structures to form a third plurality of pattern structures further includes etching portions of the first plurality of pattern structures.

6. The method of claim 1 wherein the second hard mask stack includes an oxide.

7. The method of claim 1 wherein the second hard mask stack includes a first layer including oxide, a second layer including nitride over the first layer, and a third layer including oxide over the second layer.

8. The method of claim 1 wherein:
the first pattern includes a first line running in a first direction,
the second pattern includes a line space intersecting the first line; and
a structure of the first plurality of structures includes a structure defined by the first line with a spacing defined by the line space.

9. The method of claim 1 wherein the first thickness and the second thickness are each less than an initial thickness of the second hard mask stack.

10. The method of claim 1, wherein the first layer comprises a gate electrode stack over a gate dielectric.

11. The method at claim 1 wherein:
the second hard mask stack includes a first layer portion, a second layer portion over the first layer portion, and a third layer portion over the second layer portion; and
the first partial etching further comprises etching portions of the third layer portion.

12. The method of claim 11 wherein:
the second partial etch includes etching portions of the second layer portion exposed by etching portions of the third layer portion; and
wherein the second partial etch further includes etching portions of the third layer at select locations of the third layer which were not etched during the patterning of the second hard mask stack according to the first pattern.

13. The method of claim 11 wherein the first plurality of pattern structures are substantially formed in the first layer portion.

14. The method of claim 11 wherein the third layer portion is of a different material than the second layer portion.

15. A method of making a semiconductor device, the method comprising:
providing a wafer with a first layer,
forming a non-patterned first hard mask over the first layer;
forming a second hard mask stack over the non-patterned first hard mask;
patterning the second hard mask stack according to a first pattern, wherein the patterning includes a first partial etching of the second hard mask stack to a first thickness;
patterning for a second time, the second hard mask stack according to a second pattern, wherein the patterning for a second time includes a second partial etching of the second hard mask stack to a second thickness;
blanket etching the second hard mask stack to form a first plurality of pattern structures of the second hard mask stack after the patterning for a second time, wherein the blanket etch also partially etches into portions of the first hard mask exposed by the blanket etch;
etching the first hard mask with the first plurality of pattern structures to form a second plurality of pattern structures of the first hard mask, without substantially etching portions of the first layer exposed by the etching of the first hard mask; and
etching the first layer with the second plurality of pattern structures to form a third plurality of pattern structures of the first layer, wherein portions of the wafer exposed by the etching of the first layer are kept substantially unharmed during the etching of the first layer, wherein:
the patterning the second hard mask stack according to a first pattern includes forming a fourth plurality of pattern structures over the second hard mask stack and etching the second hard mask stack with the fourth plurality of pattern structures.

16. The method of claim 15 further comprising:
removing the fourth plurality of pattern structures prior to the patterning for a second time.

17. A method of making a semiconductor device, the method comprising:
providing a wafer with a first layer,
forming a non-patterned first hard mask over the first layer;
forming a second hard mask stack over the non-patterned first hard mask;
patterning the second hard mask stack according to a first pattern, wherein the patterning includes a first partial etching of the second hard mask stack to a first thickness;
patterning for a second time, the second hard mask stack according to a second pattern, wherein the patterning for a second time includes a second partial etching of the second hard mask slack to a second thickness;
blanket etching the second hard mask stack to form a first plurality of pattern structures of the second hard mask stack after the patterning for a second time, wherein the blanket etch also partially etches into portions of the first hard mask exposed by the blanket etch;
etching the first hard mask with the first plurality of pattern structures to form a second plurality of pattern structures of the first hard mask, without substantially etching portions of the first layer exposed by the etching of the first hard mask; and
etching the first layer with the second plurality of pattern structures to form a third plurality of pattern structures of the first layer, wherein portions of the wafer exposed by the etching of the first layer are kept substantially unharmed during the etching of the first layer, wherein:
the patterning for a second time, the second hard mask stack according to the second pattern includes forming a fourth plurality of pattern structures over the second hard mask stack and etching the second hard mask stack with the fourth plurality of pattern structures.

18. The method of claim 17 further comprising:
removing a fourth plurality of pattern structures prior to the etching the second hard mask stack to form a first plurality of pattern structures of the second hard mask stack.

* * * * *

UNITED STATES PATENT AND TRADEMARK OFFICE
CERTIFICATE OF CORRECTION

PATENT NO. : 7,132,327 B2 Page 1 of 1
APPLICATION NO. : 10/853701
DATED : November 7, 2006
INVENTOR(S) : Tab A. Stephens et al.

It is certified that error appears in the above-identified patent and that said Letters Patent is hereby corrected as shown below:

In Column 10, Line 62, Claim No. 11:
    Change "at" to --of--.

Signed and Sealed this

Seventh Day of August, 2007

JON W. DUDAS
*Director of the United States Patent and Trademark Office*